US007362183B2

(12) United States Patent
Kim et al.

(10) Patent No.: US 7,362,183 B2
(45) Date of Patent: Apr. 22, 2008

(54) AMPLIFIER CIRCUIT IMPROVED IN LINEARITY AND FREQUENCY BAND

(75) Inventors: Tae Wook Kim, Austin, TX (US);
Bonkee Kim, Seongnam-si (KR);
Kwyro Lee, Seoul (KR)

(73) Assignee: Integrant Technologies, Inc., Bundang-Gu, Gyeonggi-Do (KR)

( * ) Notice: Subject to any disclaimer, the term of this patent is extended or adjusted under 35 U.S.C. 154(b) by 10 days.

(21) Appl. No.: 11/464,660

(22) Filed: Aug. 15, 2006

(65) Prior Publication Data
US 2007/0200631 A1 Aug. 30, 2007

(30) Foreign Application Priority Data
Aug. 17, 2005 (KR) .................. 10-2005-0075048

(51) Int. Cl.
*H03F 3/04* (2006.01)
(52) U.S. Cl. ..................... 330/311; 330/295
(58) Field of Classification Search ............. 330/311, 330/295, 124 R, 84
See application file for complete search history.

(56) References Cited

U.S. PATENT DOCUMENTS 6,987,422 B2* 1/2006 Vice .................... 330/285
7,023,272 B2* 4/2006 Hung et al. ............. 330/126
7,276,976 B2* 10/2007 Oh et al. ................ 330/311

* cited by examiner

Primary Examiner—Henry Choe
(74) Attorney, Agent, or Firm—Foley & Lardner LLP

(57) ABSTRACT

An amplifier circuit improved in linearity and frequency band comprises an amplification block, a feedback block and an output block. The amplification block comprises a main transistor, an auxiliary transistor, a first capacitor, a second capacitor, a main transistor bias unit, and an auxiliary transistor bias unit. The main transistor bias unit comprises a first bias resistor. The auxiliary transistor bias unit comprises a second bias resistor. The feedback block comprises first and second feedback resistors, and the output block comprises an output resistor and an output transistor.

10 Claims, 6 Drawing Sheets

AMPLIFIER CIRCUIT IMPROVED IN LINEARITY AND FREQUENCY BAND

This nonprovisional application claims priority under 35 U.S.C. § 119(a) on Patent Application No. 10-2005-0075048 filed in Republic of Korea on Aug. 17, 2005, the entire contents of which are hereby incorporated by reference.

BACKGROUND OF THE INVENTION

1. Field of the Invention

The present invention relates to an amplifier circuit, and more particularly, to an amplifier circuit improved in linearity and frequency band.

2. Description of the Background Art

FIG. 1 illustrates a conventional amplifier circuit.

As illustrated in FIG. 1, the conventional amplifier circuit includes a transistor MN1 and a resistor R1.

A source terminal of the transistor MN1 is grounded and a gate terminal of the transistor MN1 is connected to an input port of the amplifier circuit. A drain terminal of the transistor MN1 is connected to the resistor R1 and an output port of the amplifier circuit.

In the conventional amplifier circuit, linearity tends to deteriorate due to a third harmonic component that is influential when a low input voltage is applied and an intermodulation distortion (IMD) component that is additionally generated by high degree harmonic components such as fifth and seventh harmonic components when a high input voltage is applied.

SUMMARY OF THE INVENTION

Accordingly, the present invention is directed to provide an amplifier circuit improved in linearity and applicable to a wide frequency band.

According to the present invention, there is provided an amplifier circuit improved in linearity and frequency band, the amplifier circuit comprising an amplification block comprising a main transistor comprising first, second and third terminals, wherein a current flow from the second terminal to the third terminal changes according to a voltage applied to the first terminal, an auxiliary transistor comprising fourth, fifth and sixth terminals, wherein a current flow from the fifth terminal to the sixth terminal changes according to a voltage applied to the fourth terminal, a main transistor bias unit applying a bias to make the main transistor operate in a saturation region, and an auxiliary transistor bias unit applying a bias to make the auxiliary transistor operate in a sub-threshold region, wherein the second and fifth terminals are electrically connected to each other and the first and fourth terminals are electrically connected to an input port, a first feedback block electrically connected to the third terminal, and a second feedback block electrically connected to the sixth terminal.

The main transistor and the auxiliary transistor may have different transconductance values.

The first and second feedback blocks may comprise resistors.

The amplifier circuit may further comprise an output block that comprises an output transistor comprising seventh, eighth and ninth terminals, wherein a current flow from the eighth terminal to the ninth terminal changes according to a voltage applied to the seventh terminal, the ninth terminal electrically connected commonly to the second and fifth terminals.

The amplifier circuit may further comprise a feedback amplifier electrically connected to the seventh terminal and the ninth terminal.

According to the present invention, there is also provided an amplifier circuit improved in linearity and frequency band, the amplifier circuit comprising an amplification block comprising a main transistor comprising first, second and third terminals, wherein a current flow from the second terminal to the third terminal changes according to a voltage applied to the first terminal, an auxiliary transistor comprising fourth, fifth and sixth terminals, wherein a current flow from the fifth terminal to the sixth terminal changes according to a voltage supplied to the fourth terminal, a main transistor bias unit applying a bias to make the main transistor operate in a saturation region, and an auxiliary transistor bias unit applying a bias to make the auxiliary transistor operate in a sub-threshold region, wherein the second and fifth terminals are electrically connected to each other and the first and fourth are electrically connected to an input port, an output block comprising an output transistor that comprises seventh, eighth and ninth terminals, wherein a current flow from the eighth terminal to the ninth terminal changes from a voltage applied to the seventh terminal, the ninth terminal electrically connected commonly to the second and fifth terminals, and a feedback block electrically connected between the input port and an output port of the output block.

The main transistor and the auxiliary transistor may have different transconductance values.

The feedback block may comprise resistors.

The amplifier circuit may further comprise a cascode circuit, wherein the cascode circuit is electrically connected to the input port.

The amplifier circuit may further comprise a feedback amplifier electrically connected to the seventh terminal and the ninth terminal.

The present invention will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the same reference numerals in different drawings represent the same element.

BRIEF DESCRIPTION OF THE DRAWINGS

The present invention will be described in detail with reference to the following drawings in which like numerals refer to like elements.

DETAILED DESCRIPTION OF EMBODIMENTS

Embodiments of the present invention will be described in a more detailed manner with reference to the drawings.

Figure 1:
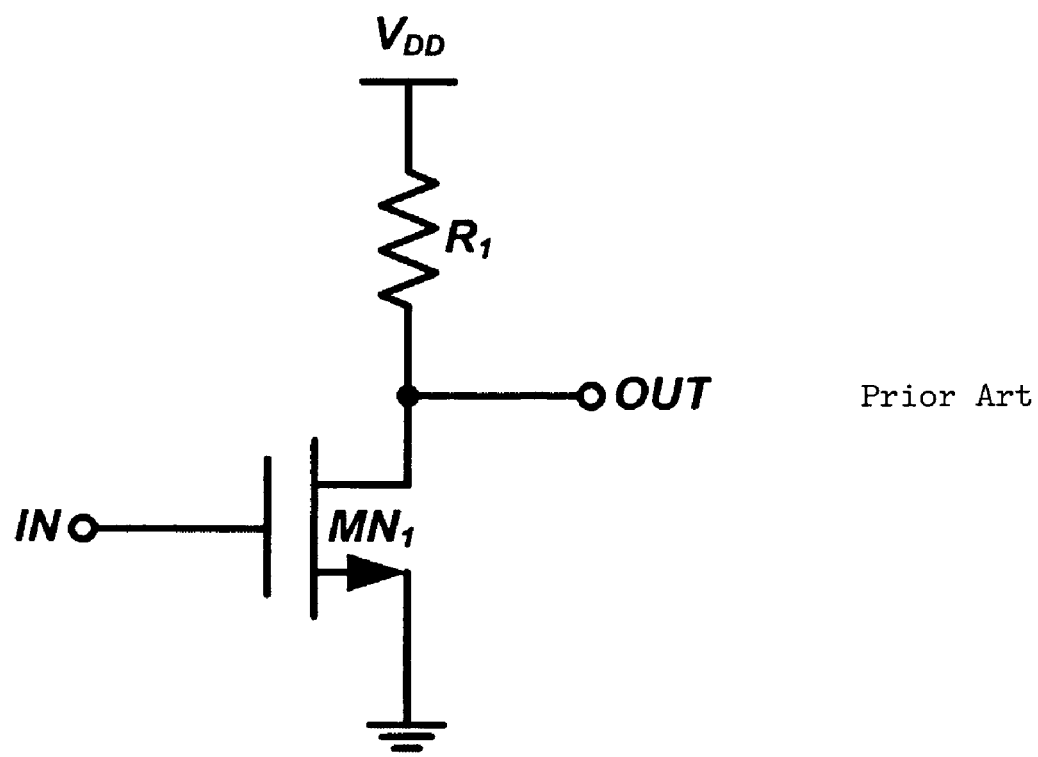
FIG. 1 illustrates a conventional amplifier circuit.
Figure 2:
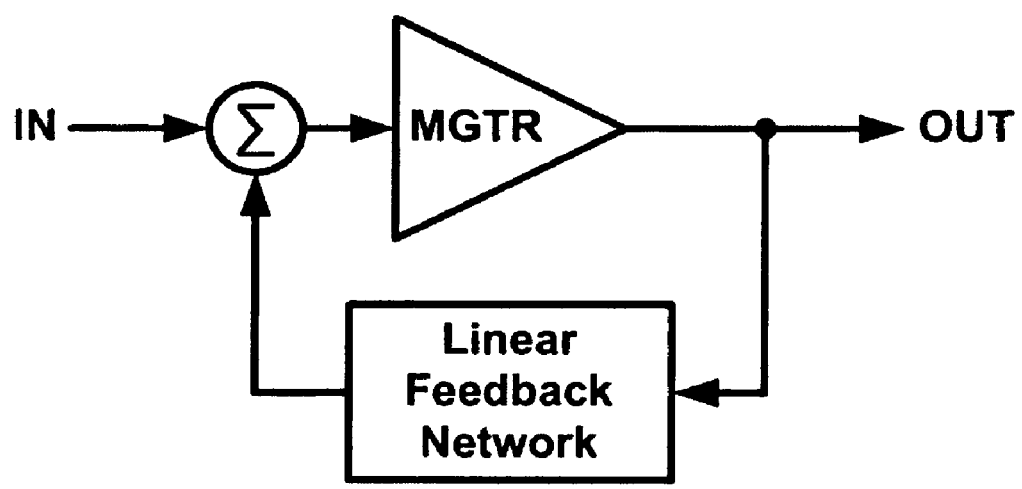
FIG. 2 illustrates a simplified circuit diagram of an amplifier circuit comprising a multiple gated transistor (MGTR) configured additionally with a feedback loop according to an embodiment of the present invention.

FIG. 2 illustrates a simplified circuit diagram of an amplifier circuit comprising a multiple gated transistor (MGTR) that is configured additionally with a feedback loop according to an embodiment of the present invention.

As illustrated in FIG. 2, the MGTR supplies a signal of an output port to an input port of the MGTR through a feedback loop. Due to this configuration, linearity of the MGTR increases although the total gain of the MGTR is reduced.

The feedback loop may be a parallel-feedback loop or a series-feedback loop The series-feedback loop will be described in detail with reference to FIGS. 3A and 3B The parallel-feedback loop will be described in detail with reference to FIGS. 4A and 4B.

Figure 3A:
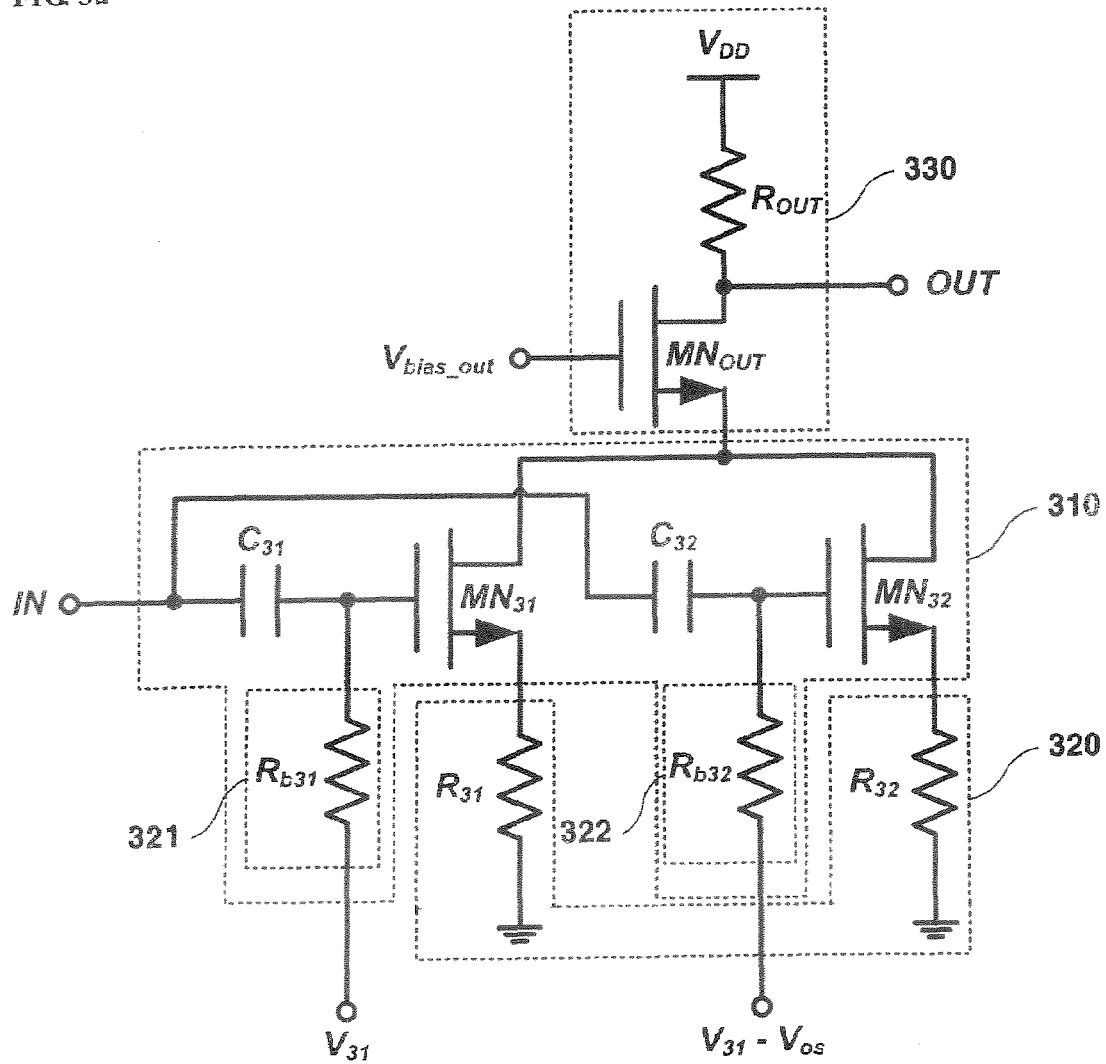
FIG. 3A illustrates an exemplary circuit diagram of an amplifier circuit according to a first specific embodiment of the present invention.

FIG. 3A illustrates an exemplary circuit diagram of an amplifier circuit according to a first specific embodiment of the present invention.

As illustrated in FIG. 3A, the amplifier circuit comprises an amplification block 310, a feedback block 320 and an output block 330.

The amplification block 310 comprises a main transistor MN31, an auxiliary transistor MN32, a first capacitor C31, a second capacitor C32, a main transistor bias unit 321, and an auxiliary transistor bias unit 322. The main transistor bias unit 321 comprises a first bias resistor Rb31. The auxiliary transistor bias unit 322 comprises a second bias resistor Rb32.

The feedback block 320 comprises first and second feedback resistors R31 and R32, and the output block 330 comprises an output resistor Rout and an output transistor MNout.

An input port IN is electrically connected to one end of the first capacitor C31 and to one end of the second capacitor C32.

The other end of the first capacitor C31 is electrically connected to a gate terminal of the main transistor MN31 and to one end of the first bias resistor Rb31. The other end of the second capacitor C32 is electrically connected to a gate terminal of the auxiliary transistor MN32 and to one end of the second bias resistor Rb32.

A source terminal of the main transistor MN31 is electrically connected to one end of the first feedback resistor R31. A source terminal of the auxiliary transistor MN32 is electrically connected to one end of the second feedback resistor R32.

The drain terminal of the main transistor MN31 and the drain terminal of the auxiliary transistor MN32 are commonly electrically connected to a source terminal of the output transistor MNout. One end of an output port OUT and one end of the output resistor Rout are commonly electrically connected to a drain terminal of the output transistor MNout.

The first capacitor C31 and the second capacitor C32 function as a DC-blocking circuit that blocks a direct current (DC) component among the signal components supplied from the input port IN to the gate terminal of the main transistor MN31 and to the gate terminal of the auxiliary transistor MN32.

The main transistor MN31 and the auxiliary transistor MN32 are electrically connected to each other in parallel to configure the MGTR. The auxiliary transistor MN32 may have a different characteristic from the main transistor MN31. Particularly the auxiliary transistor MN32 may be configured to have a different transconductance characteristic from the main transistor MN31 to reduce the IMD3 generated by the main transistor MN31. For instance, the transconductance characteristics of the main transistor MN31 and the auxiliary transistor MN32 are different from each other so that the main transistor MN31 operates in a saturation region and the auxiliary transistor MN32 operates in a sub-threshold region.

A first bias voltage V31 is applied to the other end of the first bias resistor Rb31 to make the main transistor MN31 operate in the saturation region. A second bias voltage V32 is applied to the other end of the second bias resistor Rb32 to make the auxiliary transistor MN32 operate in the sub-threshold region. A voltage difference V31-Vos between the first bias voltage V31 and an offset voltage Vos may be applied as the second bias voltage V32.

The first feedback resistor R31 is electrically connected to the source terminal of the main transistor MN31 to configure a series-feedback circuit and functions as a degeneration circuit. The second feedback resistor R32 is electrically connected to the source terminal of the auxiliary transistor MN32 to configure a series-feedback circuit and functions as a degeneration circuit.

A bias voltage Vbias_out is applied to a gate terminal of the output transistor MNout to separate the input port IN and the output port OUT of the amplification block 310 from each other as a circuit, This circuit separation configuration allows the reduction in signal interference between the input port IN and the output port OUT.

According to the embodiment of the present invention, an amplification amount of high degree harmonic components such as fifth and seventh harmonic components can be reduced, thereby resulting in an improvement on linearity.

Figure 3B:
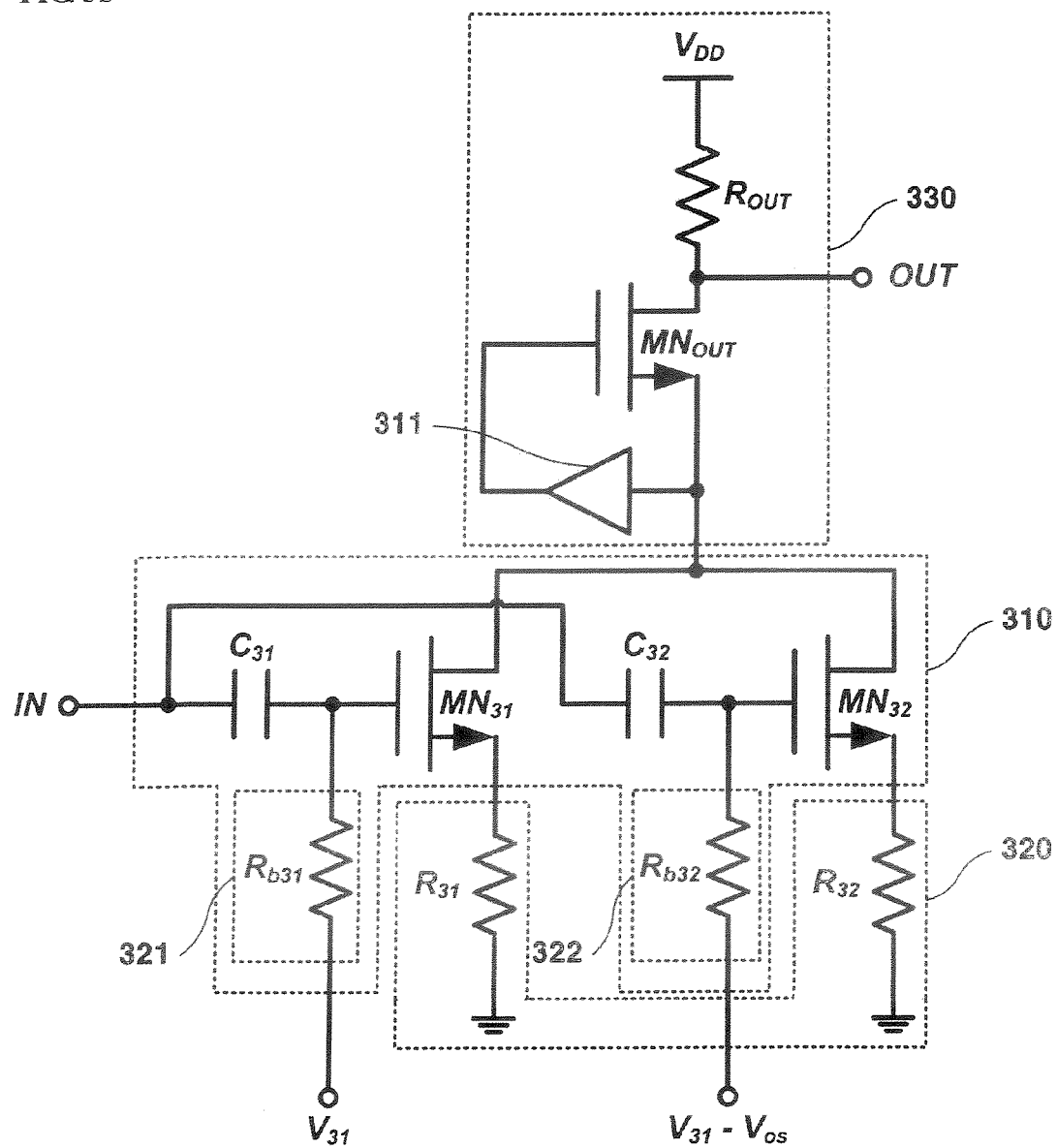
FIG. 3B illustrates another exemplary circuit diagram of an amplifier circuit modified by adding a feedback amplifier to the amplifier circuit illustrated in FIG. 3A.

FIG. 3B illustrates another exemplary circuit diagram of an amplifier circuit modified by adding a feedback amplifier to the amplifier circuit illustrated in FIG. 3A.

As illustrated in FIG. 3B, the amplifier circuit comprises an amplification block 310, a feedback block 320 and an output block 330. Since the amplification block 310 and the feedback block 320 illustrated in FIG. 3B are substantially the same as those illustrated in FIG. 3A, detailed description thereof in FIG. 3B will be replaced by the description provided in FIG. 3A. Hereinafter, the output block 330 will be described in detail.

The output block 330 comprises an output resistor Rout, an output transistor MNout and a feedback amplifier 311. One end of an output port OUT and one end of the output resistor Rout are commonly electrically connected to a drain terminal of the output transistor MNout. An input port of the feedback amplifier 311 is electrically connected to a source terminal of the output transistor MNout, and an output port of the feedback amplifier 311 is electrically connected to a gate terminal of the output transistor MNout.

The feedback amplifier 311 allows the reduction in input impedance at the gate terminal of the output transistor MNout. Therefore, the influence of harmonic feedback that is usually generated at drain terminals of main and auxiliary transistors MN31 and MN32 is more likely to reduce, and the linearity can be improved by a level of approximately 2 dB to 3 dB.

Due to the above modified configuration of the amplifier circuit, an amplification amount of high degree harmonic components (e.g., fifth and seventh harmonic components) can be reduced The feedback amplifier causes the gate and drain terminals of the target transistor to have a decreased feedback level. As a result, the linearity can be improved.

Figure 4A:
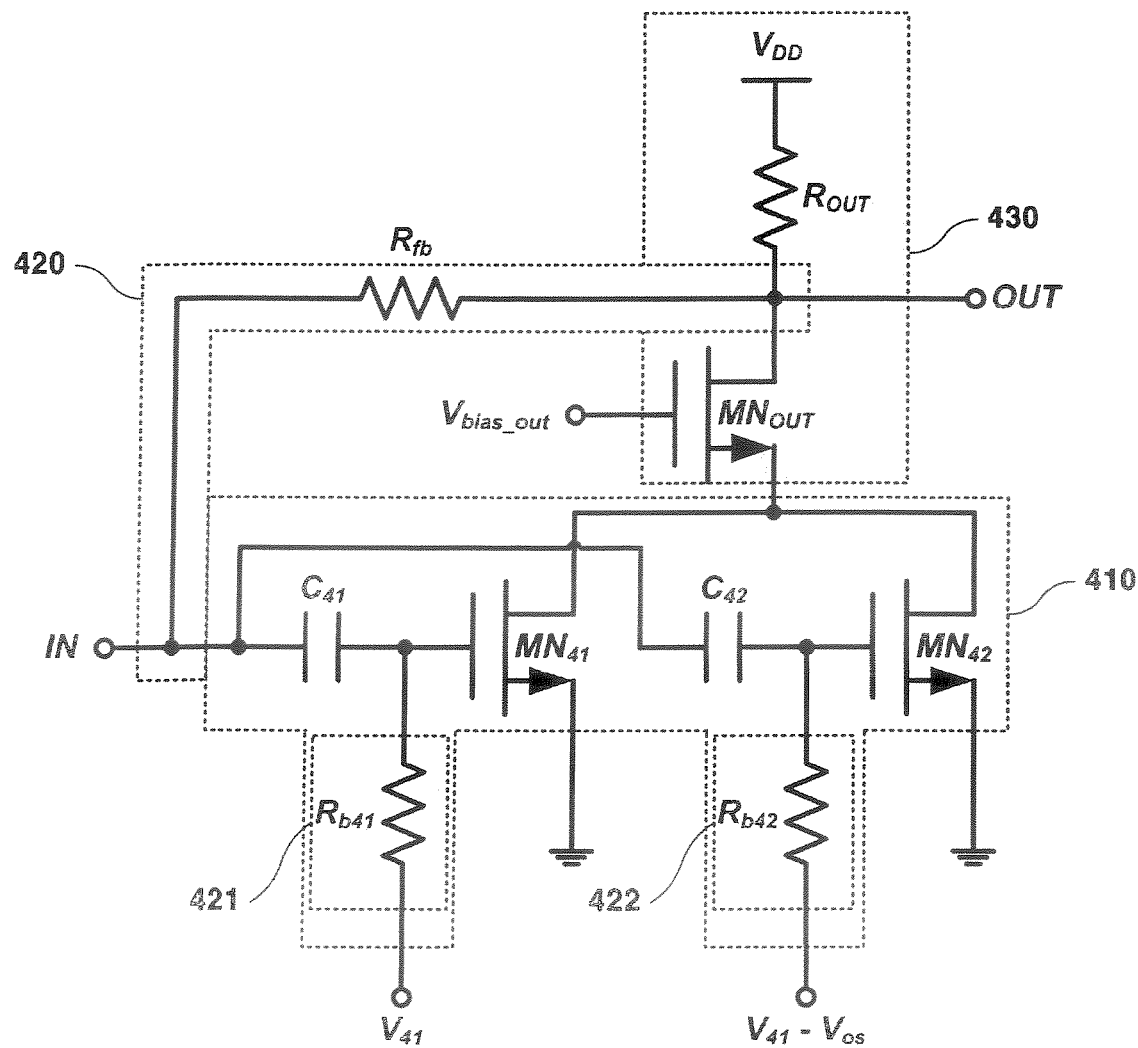
FIG. 4A illustrates an exemplary circuit diagram of an amplifier circuit according to a second specific embodiment of the present invention.

FIG. 4A illustrates an exemplary circuit diagram of an amplifier circuit according to a second specific embodiment of the present invention.

As illustrated in FIG. 4a, the amplifier circuit comprises an amplification block 410, a feedback block 420 and an output block 430.

The amplification block 410 comprises a main transistor MN41, an auxiliary transistor MN42, a first capacitor C41, a second capacitor C42, a main transistor bias unit 421, and an auxiliary transistor bias unit 422. The main transistor bias unit 421 comprises a first bias resistor Rb4l. The auxiliary transistor bias unit 422 comprises a second bias resistor Rb42.

The output block 430 comprises an output resistor Rout and an output transistor MNout.

The feedback block 420 comprises a feedback resistor Rfb and configures a feedback loop in the MGTR.

An input port IN is electrically connected to one end of the first capacitor C41 and to one end of the second capacitor C42. The other end of the first capacitor C41 is electrically connected to a gate terminal of the main transistor MN41 and to one end of the first bias resistor Rb4l. The other end of the second capacitor C42 is electrically connected to a gate terminal of the auxiliary transistor MN42 and to one end of the second bias resistor Rb42.

A drain terminal of the main transistor MN41 and the drain terminal of the auxiliary transistor MN42 are commonly electrically connected to a source terminal of the output transistor MNout.

One end of the feedback resistor Rfb, one end of the output resistor Rout, and one end of the output port OUT are commonly electrically connected to a drain terminal of the output transistor MNout. The other end of the feedback resistor Rfb is electrically connected to the input port IN.

The first capacitor C41 and the second capacitor C42 function as a DC-blocking circuit that blocks a DC component among the signal components supplied from the input port IN to the gate terminal of the main transistor MN41 and to the gate terminal of the auxiliary transistor MN42.

The main transistor MN41 and the auxiliary transistor MN42 are electrically connected to each other in parallel to configure the MGTR.

Since the amplification block 410 and the output block 430 are substantially the same as those illustrated in FIG. 3A, detailed description thereof will be replaced by the description provided in FIG. 3A.

The feedback resistor Rfb of the feedback block 420 is electrically connected between the output port OUT and the input port IN to perform a feedback operation of an output signal provided from the output port OUT.

Due to the above-described configuration, an amplification amount of high degree harmonic components (e.g., fifth and seventh harmonic components) can be reduced, thereby improving the linearity.

Figure 4B:
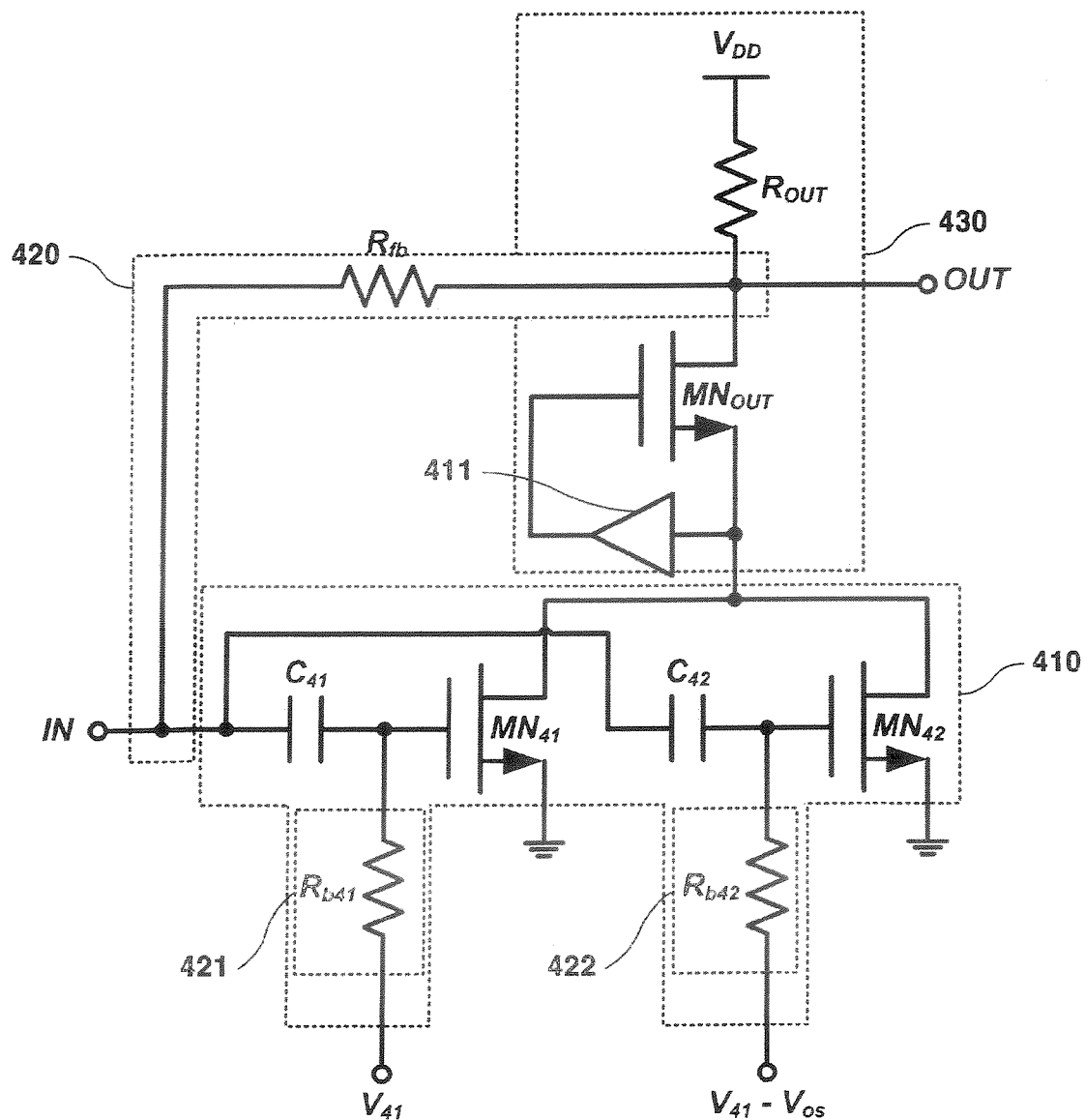
FIG. 4B illustrates another exemplary circuit diagram of an amplifier circuit modified by adding a feedback amplifier to the amplifier circuit illustrated in FIG. 4A.

FIG. 4B illustrates another exemplary circuit diagram of an amplifier circuit modified by adding a feedback amplifier to the amplifier circuit illustrated in FIG. 4A.

As illustrated in FIG. 4B, the amplifier circuit comprises an amplification block 410, a feedback block 420 and an output block 430. Since the amplification block 410 and the feedback block 420 are substantially the same as those illustrated in FIG. 4A, detailed description thereof will be replaced by the description provided in FIG. 4A. Hereinafter, the output block 430 will be described in detail.

An input port of a feedback amplifier 411 of the output block 430 is electrically connected to a source terminal of the output transistor MNout, and an output port of the feedback amplifier 411 is electrically connected to a gate terminal of an output transistor MNout.

Due to the feedback amplifier 411, the gate terminal of the output transistor MNout can have a decreased level of input impedance. Therefore, the influence of harmonic feedback can be reduced, and the linearity can be improved by a level of approximately 2 dB to 3 dB.

According to the above modified amplifier circuit, an amplification amount of high degree harmonic components (e.g., fifth and seventh harmonic components) can be reduced, and the feedback amplifier can decrease a feedback level between the gate terminal and the drain terminal of the target transistor. As a result, the linearity can be improved.

Figure 5:
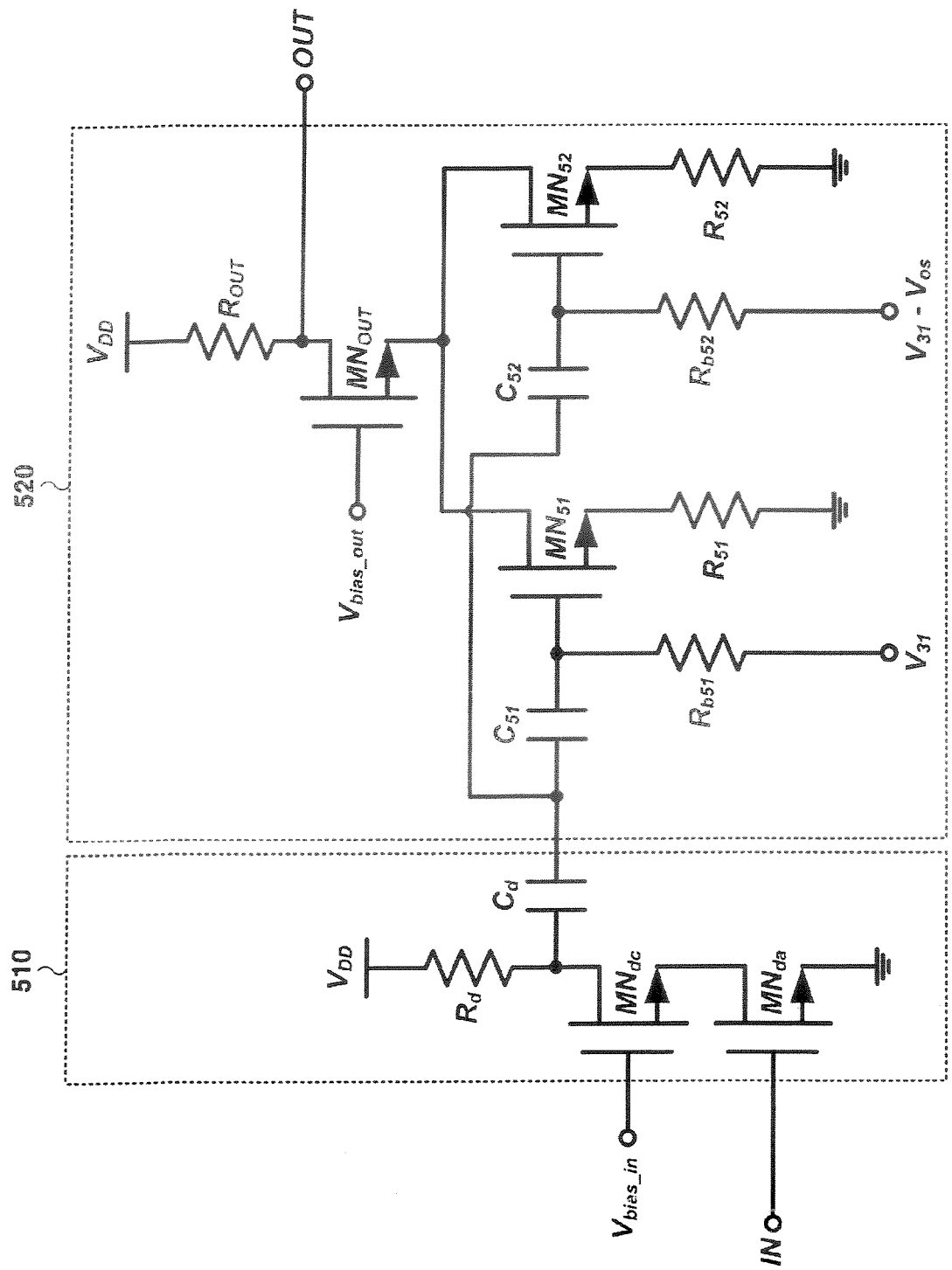
FIG. 5 illustrates an exemplary circuit diagram of an amplifier circuit according to a third specific embodiment of the present invention.

FIG. 5 illustrates a circuit diagram of an amplifier circuit according to a third specific embodiment of the present invention.

As illustrated in FIG. 5, the amplifier circuit comprises a free-amplification block 510 and a post-amplification block 520. Since the post-amplification block 520 is substantially the same as the amplifier circuit illustrated in FIG. 3A, detailed description thereof will be replaced by the description provided in FIG. 3A.

The free-amplification block 510 comprises a driver transistor MNda, a cascode transistor MNdc, a resistor Rd, and a capacitor Cd.

An input port IN is electrically connected to a gate terminal of the driver transistor MNda, A source terminal of the driver transistor MNda is grounded and a drain terminal of the driver transistor MNda is electrically connected to a source terminal of the cascode transistor MNdc. One end of the resistor Rd and one end of the capacitor Cd are commonly electrically connected to a drain terminal of the cascode transistor MNdc. The other end of the capacitor Cd is electrically connected individually to one end of each of a first capacitor C51 and a second capacitor C52 of the post-amplification block 520.

The driver transistor MNda and the cascode transistor MNdc of the free-amplification block 510 are electrically connected in a cascode structure. The free-amplification block 510 amplifies a signal supplied to the input port IN and outputs the amplified signal to the one end of the first capacitor C51 and to the one end of the second capacitor C52 of the post-amplification block 520.

According to the above-described configuration, an amplification amount of high degree harmonic components (e.g., fifth and seventh harmonic components) can be reduced, and an amplifier circuit that has high gain and linearity characteristics can be configured using the free-amplification block 510.

According to various embodiments of the present invention, the amplifier circuit that has high linearity at a wide frequency band can be configured.

The invention being thus described, it will be obvious that the same may be varied in many ways. Such variations are not to be regarded as a departure from the spirit and scope of the invention, and all such modifications as would be obvious to one skilled in the art are intended to be comprised within the scope of the following claims.

What is claimed is:

1. An amplifier circuit improved in linearity and frequency band, the amplifier circuit comprising:
   an amplification block comprising a main transistor comprising first, second and third terminals, wherein a current flow from the second terminal to the third terminal changes according to a voltage applied to the first terminal; an auxiliary transistor comprising fourth, fifth and sixth terminals, wherein a current flow from the fifth terminal to the sixth terminal changes according to a voltage applied to the fourth terminal; a main transistor bias unit applying a bias to make the main transistor operate in a saturation region; and an auxiliary transistor bias unit applying a bias to make the auxiliary transistor operate in a sub-threshold region, wherein the second and fifth terminals are electrically connected to each other and the first and the fourth terminals are electrically connected to an input port;
   a first feedback block electrically connected to the third terminal; and
   a second feedback block electrically connected to the sixth terminal.

2. The amplifier circuit as claimed in claim 1, wherein the main transistor and the auxiliary transistor have different transconductance values.

3. The amplifier circuit as claimed in claim 1, wherein the first and second feedback blocks comprise resistors.

4. The amplifier circuit as claimed in claim 1, further comprising an output block that comprises an output transistor comprising seventh, eighth and ninth terminals, wherein a current flow from the eighth terminal to the ninth terminal changes according to a voltage applied to the seventh terminal, the ninth terminal electrically connected commonly to the second and fifth terminals.

5. The amplifier circuit as claimed in claim 4, further comprising a feedback amplifier electrically connected to the seventh terminal and the ninth terminal.

6. An amplifier circuit improved in linearity and frequency band, the amplifier circuit comprising:
   an amplification block comprising a main transistor comprising first, second and third terminals, wherein a current flow from the second terminal to the third terminal changes according to a voltage applied to the first terminal; an auxiliary transistor comprising fourth, fifth and sixth terminals, wherein a current flow from the fifth terminal to the sixth terminal changes according to a voltage supplied to the fourth terminal; a main transistor bias unit applying a bias to make the main transistor operate in a saturation region; and an auxiliary transistor bias unit applying a bias to make the auxiliary transistor operate in a sub-threshold region, wherein the second and fifth terminals are electrically connected to each other and the first and fourth terminals are electrically connected to an input port;
   an output block comprising an output transistor that comprises seventh, eighth and ninth terminals, wherein a current flow from the eighth terminal to the ninth terminal changes from a voltage applied to the seventh terminal, the ninth terminal electrically connected commonly to the second and fifth terminals; and
   a feedback block electrically connected between the input port and an output port of the output block.

7. The amplifier circuit as claimed in claim 6, wherein the main transistor and the auxiliary transistor have different transconductance values.

8. The amplifier circuit as claimed in claim 6, wherein the feedback block comprises resistors.

9. The amplifier circuit as claimed in claim 6, further comprising a cascode circuit, wherein the cascode circuit is electrically connected to the input port.

10. The amplifier circuit as claimed in claim 9, further comprising a feedback amplifier electrically connected to the seventh terminal and the ninth terminal.

* * * * *